United States Patent [19]

Milligan et al.

[11] Patent Number: 5,218,034
[45] Date of Patent: Jun. 8, 1993

[54] POLYIMIDE FILM WITH TIN OR TIN SALT INCORPORATION RESULTING IN IMPROVED ADHESION

[75] Inventors: Stuart N. Milligan, Circleville; Yia-Ching Ray, Columbus, both of Ohio

[73] Assignee: E. I. du Pont de Nemours and Company, Wilmington, Del.

[21] Appl. No.: 746,682

[22] Filed: Aug. 21, 1991

Related U.S. Application Data

[63] Continuation-in-part of Ser. No. 586,612, Sep. 21, 1990, abandoned.

[51] Int. Cl.$^5$ .............................................. C08K 5/09
[52] U.S. Cl. .................................. 524/399; 524/401; 524/434
[58] Field of Search ......................... 524/399, 401, 434

[56] References Cited

U.S. PATENT DOCUMENTS

| | | | |
|---|---|---|---|
| 3,389,111 | 6/1968 | McKeown et al. | 524/176 |
| 4,755,424 | 7/5988 | Takeoka et al. | 428/323 |
| 4,931,365 | 6/1990 | Inoue et al. | 428/458 |

Primary Examiner—Paul J. Thibodeau
Assistant Examiner—D. S. Nakarani

[57] ABSTRACT

A polyimide film having improved adhesion and thermal durability containing from 0.02 to 1% by weight of tin based on the weight of the film. A process for preparing a polyimide film is also described wherein a tin (II) or tin (IV) salt is introduced into a film-forming polyamide acid polymer prior to the casting step.

4 Claims, 5 Drawing Sheets

LOG ELONGATION vs. TIME
300°C

LOG ELONGATION vs. TIME
325°C

LOG ELONGATION vs. TIME
350°C

LOG ELONGATION vs. TIME
375°C

LOG TENSILE STRENGTH vs. TIME
300°C

LOG TENSILE STRENGTH vs. TIME
325°C

LOG TENSILE STRENGTH vs. TIME
350°C

LOG TENSILE STRENGTH vs. TIME
375°C

THERMAL DURABILITY
LOG TIME vs 1/TEMP. FOR ELONG'N DATA

THERMAL DURABILITY
LOG TIME vs 1/TEMP. FOR TEN. STR. DATA

POLYIMIDE FILM WITH TIN OR TIN SALT INCORPORATION RESULTING IN IMPROVED ADHESION

CROSS REFERENCE TO RELATED APPLICATION

This application is a continuation-in-part of application Ser. No. 07/586,612 filed Sep. 21, 1990 and now abandoned.

BACKGROUND OF THE INVENTION

The present invention relates to a polyimide film containing small amounts of tin salts for improving adhesive properties and thermal durability.

Polyimide films are well-known for their outstanding properties such as heat resistance, low temperature resistance, chemical resistance, electrical insulation and mechanical strength. Such polyimide films are widely used as electrical insulating films and as flexible printed circuit substrates. In such applications, the polyimide films are usually bonded to a copper foil with an acrylic or epoxy adhesive and, therefore, good adhesion is an important property requirement. Polyimide films having high thermal durability are also desired for use as insulators, gaskets or other parts which are exposed to high temperature environments.

U.S. Pat. No. 4,742,099, issued to Nagano et al. on May 3, 1988, discloses a polyimide film containing from 0.1 to 2% of a titanium-based organometallic compound for improving adhesion. The polyimide film of the invention does not contain an organometallic titanium compound.

Macromolecules, 17, pp. 1627–1632 (1984) discloses a polyimide film containing from 1.6 to 6.6% tin (II) chloride or dibutyltin (II) chloride for reducing electrical resistivity of the film.

Polymer, 29, pp. 559–565 (1988) discloses an electrically conductive polyimide film containing 6.3% of a metallic tin (II) salt.

In the present invention, only small amounts of tin salts are used to improve adhesion as contrasted to the prior art which uses large amounts to improve electrical conductivity.

It is an object of the present invention to provide a polyimide film having improved adhesive properties and high thermal durability. It is another object of the invention to provide a polyimide film having improved adhesive properties when bonded to metal foils, such as copper foil, using an epoxy, acrylic or other heat-resistant resin adhesive.

SUMMARY OF THE INVENTION

According to the present invention there is provided a polyimide film having a surface adhesion of at least 7 pli (in accordance with IPC Method 2.4.9 Revision C) comprising a tin (II) or tin (Iv) salt contained within said film, the amount of tin in said polyimide film being from 0.02 to 1% by weight based on the weight of the film.

A process for preparing a polyimide film is also provided which comprises introducing from 0.02 to 10% by weight, based on the weight of the final film, of a tin (II) or tin (IV) salt into a film-forming polyamide acid polymer prior to the casting step, the amount of tin in said polyimide film being from 0.02 to 1% by weight based on the weight of the film.

DETAILED DESCRIPTION OF THE INVENTION

Figure 1A:
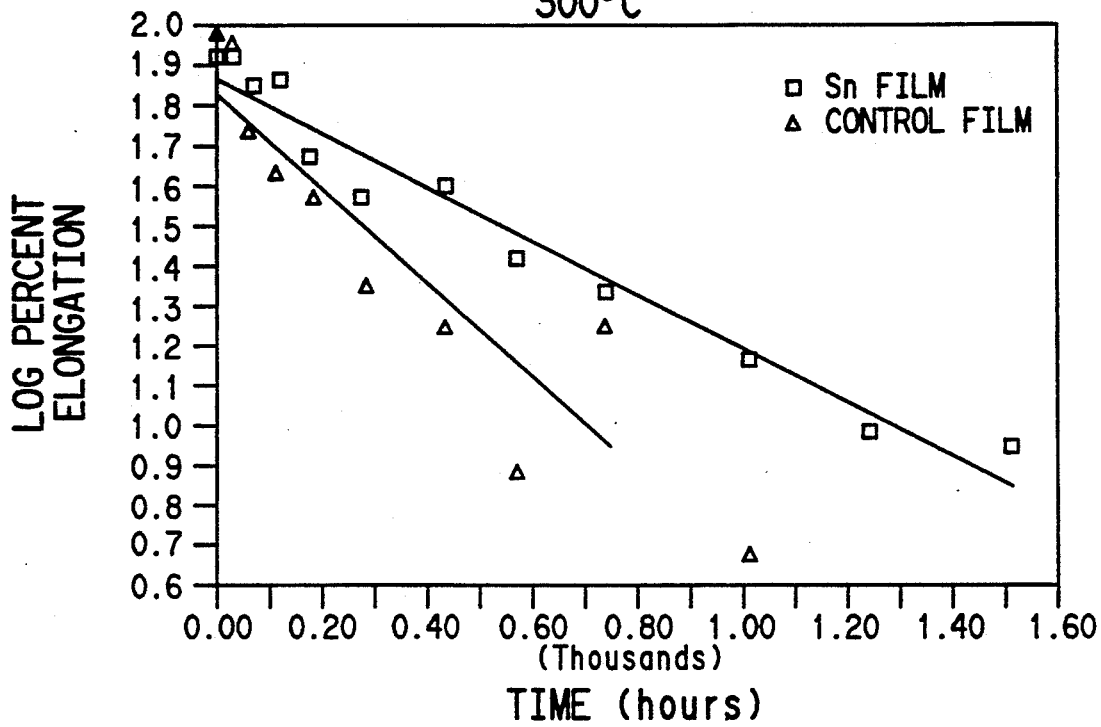
FIGS. 1a, 1b, 1c and 1d show plots of log elongation vs. time at temperatures of 300° C., 325° C., 350° C. and 375° C. for a control film and a film of the invention.
Figure 1B:
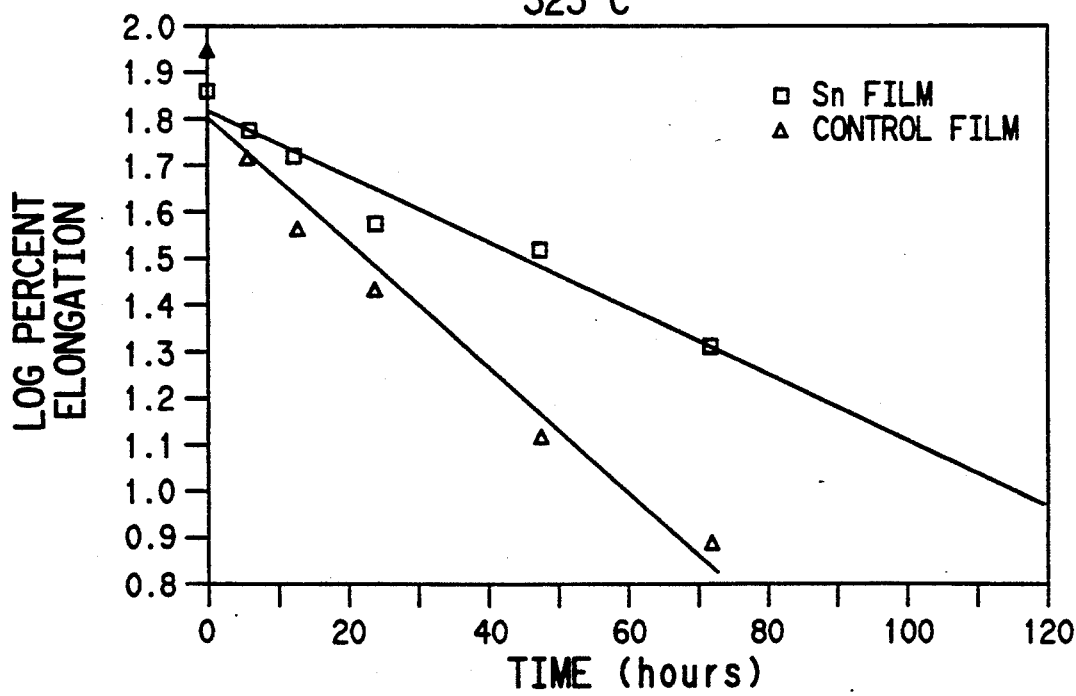
Figure 1C:
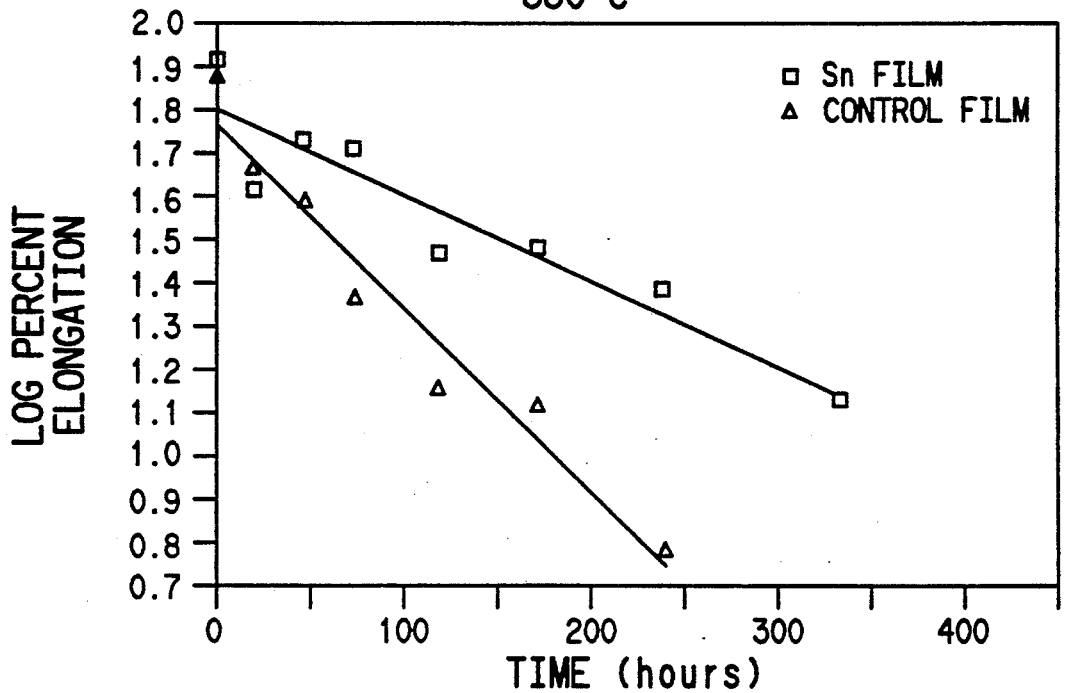
Figure 1D:
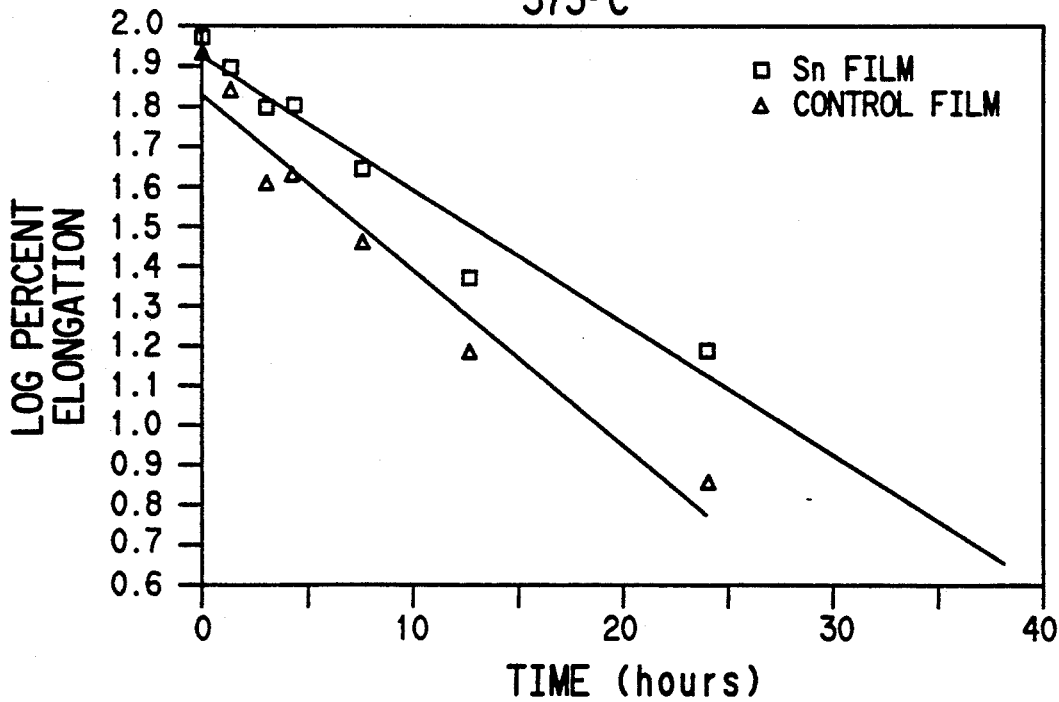
Figure 2A:
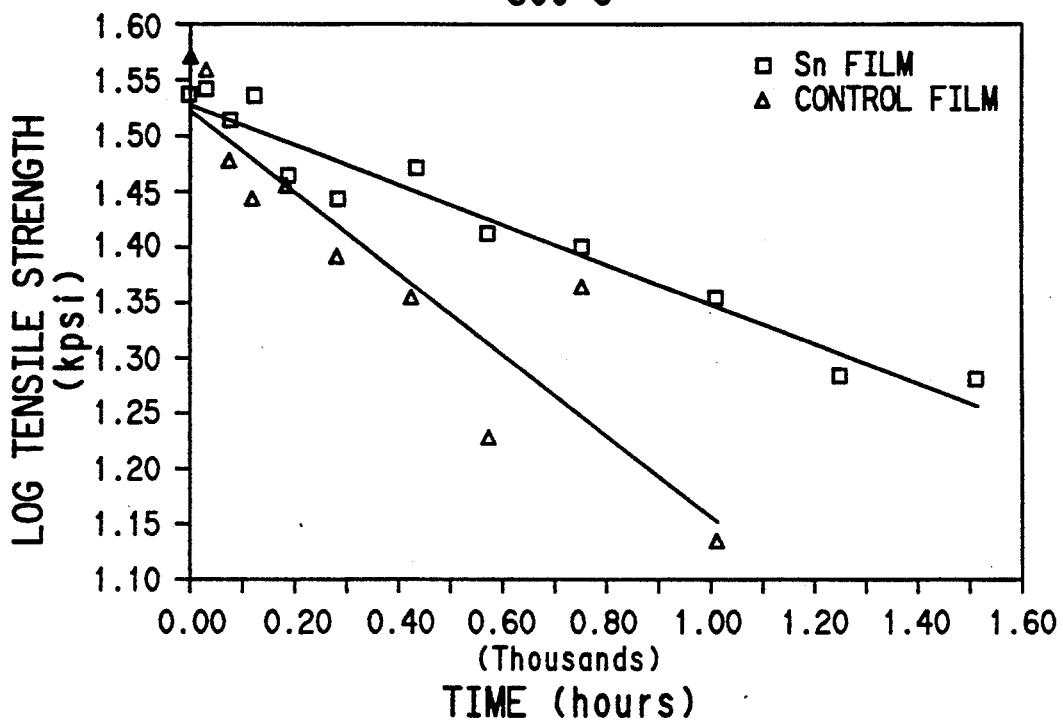
FIGS. 2a, 2b, 2c and 2d show plots of log tensile strength vs. time at temperatures of 300° C., 325° C., 350° C. and 375° C. for a film of the invention.
Figure 2B:
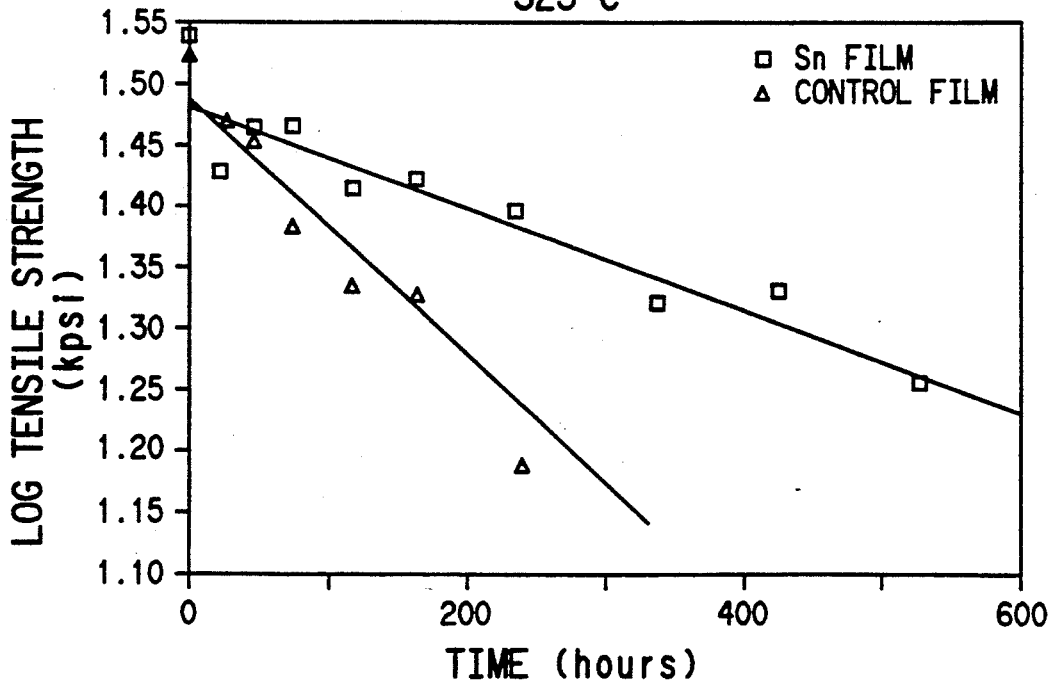
Figure 2C:
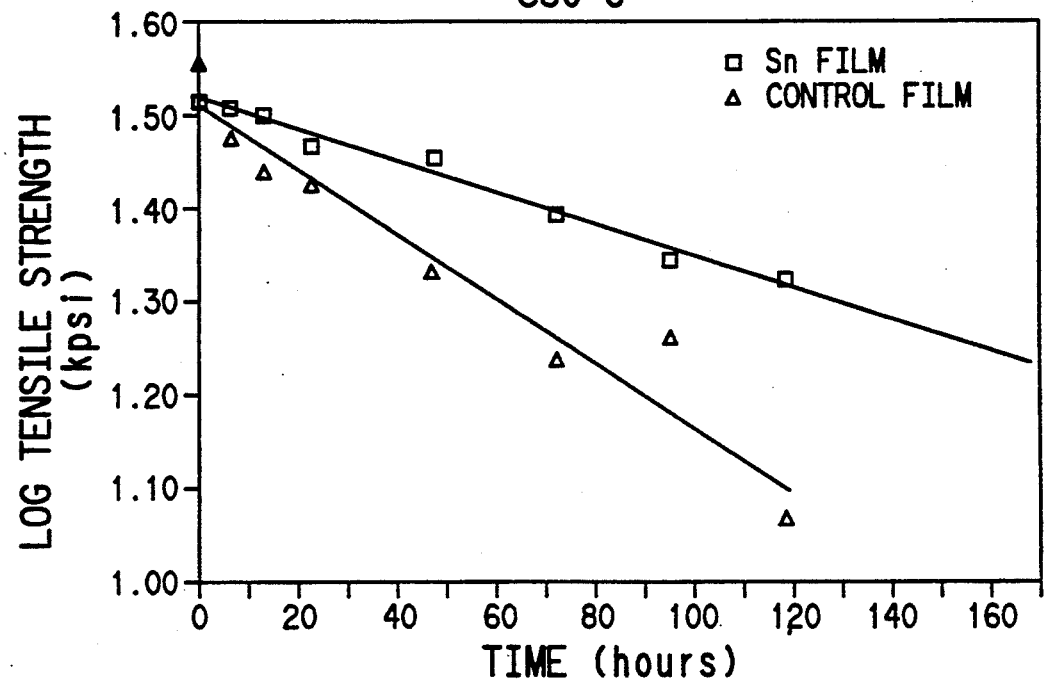
Figure 2D:
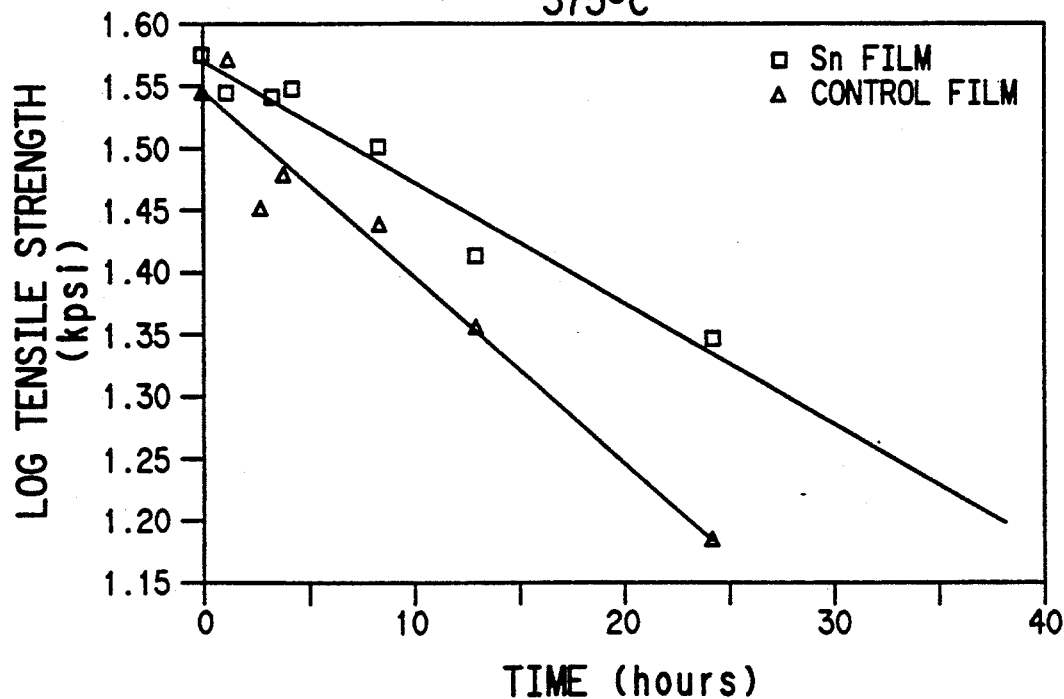

The polyimide films used in this invention can be made generally as disclosed in U.S. Pat. Nos. 3,179,630 and 3,179,634, the disclosures of which are hereby incorporated by reference. Polyamide acids are made by dissolving substantially equimolar amounts of at least one aromatic dianhydride and at least one diamine in a solvent and agitating the resulting solution under controlled temperature conditions until polymerization of the dianhydride and the diamine is completed.

Suitable dianhydrides for use in the polyimides include: pyromellitic dianhydride; 2,3,6,7-naphthalene tetracarboxylic dianhydride; 3,3',4,4'-biphenyl tetracarboxylic dianhydride; 1,2,5,6-naphthalene tetracarboxylic dianhydride; 2,2',3,3'-biphenyl tetracarboxylic dianhydride; 3,3',4,4'-benzophenone tetracarboxylic dianhydride; 2,2-bis(3,4dicarboxyphenyl) propane dianhydride; 3,4,9,10-perylene tetracarboxylic dianhydride; bis(3,4-dicarboxyphenyl) propane dianhydride; 1,1-bis(2,3-dicarboxyphenyl) ethane dianhydride; 1,1-bis(3,4-dicarboxyphenyl) ethane dianhydride; bis(2,3-dicarboxyphenyl) methane dianhydride; bis(3,4-dicarboxyphenyl) methane dianhydride; oxydiphthalic dianhydride; bis(3,4dicarboxyphenyl) sulfone dianhydride; and the like.

Suitable diamines for use in the polyimides include: 4,4'-diaminodiphenyl propane; 4,4'-diamino diphenyl methane; benzidine; 3,3'-dichlorobenzidine; 4,4'-diamino diphenyl sulfide; 3,3'-diamino diphenyl sulfone; 4,4'-diamino diphenyl sulfone; 4,4'-diamino diphenyl ether; 1,5-diamino naphthalene; 4,4'-diamino diphenyl diethylsilane; 4,4'-diamino diphenylsilane; 4,4'-diamino diphenyl ethyl phosphine oxide; 4,4'-diamino diphenyl N-methyl amine; 4,4'-diamino diphenyl N-phenyl amine; 1,4-diaminobenzene (p-phenylene diamine); 1,3-diaminobenzene; 1,2-diaminobenzene; and the like.

The preferred polyimide film used in this invention is derived from 4,4'-diaminodiphenyl ether and pyromellitic dianhydride.

Copolyimides derived from any of the above diamines and dianhydrides are also operable. Particularly preferred copolyimides are those derived from 15 to 85 mole % of biphenyltetracarboxylic dianhydride, 15 to 85 mole % pyromellitic dianhydride, 30 to 100 mole % p-phenylenediamine and 0 to 70 mole % of 4,4'-diaminodiphenyl ether. Such copolyimides are described in U.S. Pat. No. 4,778,872 which disclosure is also incorporated herein by reference.

The solvent must dissolve one or both of the polymerizing reactants and, preferably, will dissolve the polyamide acid polymerization product. The solvent must be substantially unreactive with all of the polymerizing reactants and with the polyamide acid polymerization product.

Preferred solvents include normally liquid N,N-dialkylcarboxylamides, generally. Preferred ones of those solvents include the lower molecular weight members of such carboxylamides, particularly N,N-dimethylformamide and N,N-diethylacetamide. Other solvents which may be used are dimethylsulfoxide, N-methyl-2-pyrrolidone, tetramethyl urea, dimethylsulfone, hexamethylphosphoramide, tetramethylene sulfone, and the like. The solvents can be used alone, in combinations with one another or in combinations with poor solvents such as benzene, benzonitrile, dioxane, etc. The amount of solvent used preferably ranges from 75 to 90 weight % of the polyamic acid, since this concentration has been found to give optimum molecular weight.

The polyamide acid solutions are generally made by dissolving the diamine in a dry solvent and slowly adding the dianhydride under conditions of agitation and controlled temperature in an inert atmosphere. The diamine is conveniently present as a 5 to 15 weight percent solution in the solvent and the diamine and dianhydride are usually used in about equimolar amounts.

The polyimide film of this invention can be obtained by introducing from 0.02 to 10% by weight of a tin (II) or tin (IV) salt, prior to the casting step, into the film-forming polyamide acid solution or while the polymerization of polyamide acid is being performed.

The polyamide acid containing the tin salt can be cast as either a partially cured gel film or a solvated film. The term gel film means a sheet of the polyamide acid polymer which is laden with volatiles, primarily solvent, to such an extent that the polymeric material is in a gel-swollen, plasticized, rubbery condition. The gel film thickness generally falls in the range of 2 to 25 mils. The volatile content is usually in the range of 80 to 90% by weight of the gel film. The gel film is self-supporting and partially and incompletely cured, i.e., is at an intermediate stage of curing from polyamide-acid to polyimide.

The gel film structure can be prepared by the method described in U.S. Pat. No. 3,410,826 by mixing a chemical converting agent and a catalyst, such as a lower fatty acid anhydride and a tertiary amine, respectively, into the polyamide acid solution at a low temperature, followed by casting the polyamide acid solution in film form on a casting surface and then mildly heating at, for example, 100° C. to activate the conversion agent and catalyst for transforming the cast film to a polyamide acid-polyimide gel film.

The gel film is subsequently dried to remove the water, residual solvent, and remaining conversion chemicals, and the polyamide acid is completely converted to polyimide. The drying can be conducted at relatively mild conditions without complete conversion of polyamide acid to polyimide at that time, or the drying and conversion can be conducted at the same time using higher temperatures. Because the gel has so much liquid which must be removed during the drying and converting steps, the gel must be restrained during drying to avoid undesired shrinkage. In continuous production, the film can be held at the edges, such as in a tenter frame using tenter clips or pins for restraint. A polyimide film which is permitted to shrink excessively during drying and conversion is brittle and lacks the superior performance characteristics expected of polyimide film materials.

Preferably, high temperatures are used for short times to dry the film and convert it to polyimide in the same step. It is preferred to heat the film to a temperature of 200°-550° C. for 15 to 400 seconds. Of course, less heat and time are required for thin films than for thicker films. During this drying and converting, the film is restrained from undue shrinking and, in fact, can be stretched by as much as 200% of its initial dimension prior to completion of the drying and conversion. Stretching can be in any dimension. In film manufacture, stretching can be in either the longitudinal direction or the transverse direction. If desired restraint can also be provided to permit some limited degree of shrinkage. Shrinkage of as much as 15% has been found to provide an adequate product.

A solvated film of the polyamide acid is a film which is all polyamide acid or which has only a low polyimide content, say 0 to 25%, and which is about 50 to 75% by weight polymer and 25 to 50% by weight solvent. Such film is sufficiently strong to be self-supporting.

The solvated polyamide acid can be prepared by casting the polyamide acid solution on a casting surface and heating at a temperature above 50° C. to partially convert the polyamide acid to polyimide. The extent of polyamide acid conversion depends on the temperature employed and the time of exposure, but, generally about 25 to 95% of the amide acid groups are converted to imide groups. The partially converted polyamide acid is then heated at or above 220° C. to obtain complete conversion to the polyimide.

The polyimide film of this invention contains from 0.02 to 1% by weight of tin based on the weight of the film. A further example of a suitable range is 0.1 to 1%. Using amounts of tin less than 0.1%, and particularly less than 0.02%, little improvement in adhesive properties is obtained A preferred amount of tin present in the film ranges from 0.05 to 0.7% by weight and more preferred 0.2 to 0.7%.

Tin (II) and tin (IV) salts having utility in the invention include stannous and stannic chloride, bromide, and iodide; tin acetate and carboxylates and others. Tin halides, such as tin chloride are particularly useful in the invention. Adhesion improvement is not particularly dependent on the tin oxidation state. The salts may be anhydrous or hydrated and may contain neutral coordinated ligands such as A particularly preferred tin salt is stannous chloride which when used in a concentration of from 0.2 to 0.7 weight % provides a peel strength of at least 7 pli when used in adhesively bonded polyimide copper laminates.

The advantageous properties of this invention can be observed by reference to the following examples which illustrate, but do not limit, the invention. All parts and percentages are by weight unless otherwise indicated.

EXAMPLE 1 (CONTROL EXAMPLE 1C)

Control Example 1C

A 20.3% solids solution of PMDA/ODA polyamic acid (30.0 g) was thoroughly mixed with DMAc (12.7 ml) and cooled to about 0° C. in an ice/water bath. Acetic anhydride (3.6 ml) was thoroughly mixed into the solution followed by beta-picoline (3.7 ml) which was also thoroughly mixed into the solution. The solution was centrifuged to remove the air bubbles and then cast onto a glass plate using a stainless steel rod supported at a fixed height above the glass plate surface by adhesive tape. The glass plate and film were heated on a hot plate at about 90° C. for 5 minutes before being removed from the heat and cooled. The partially imidized film was stripped from the glass plate and restrained on a frame. The film was cured by placing the frame and film into a forced air oven for 20 minutes at 250° C. The film and frame was further cured in the frame at 400° C. for 5 minutes before removing from the frame.

EXAMPLE 1

$SnCl_2$ (0.040 g) was dissolved in a 20.3% solids DMAc solution of PMDA/ODA polyamic acid (30.0 g) with thorough mixing. The resulting solution was thoroughly mixed with DMAc, cooled, acetic anhydride and beta-picoline thoroughly mixed into the solution, centrifuged, cast into a film, and cured as in Control Example 1C. The final film contained 0.45% Sn.

Two-sided copper laminates were prepared by laminating samples of the control polyimide film and the stannous chloride containing polyimide film with acrylic sheet adhesive and copper foil at 177° C. and 100 psi.

Adhesion strength of the laminates was determined according to IPC (Institute Printed Circuits) Method 2.4.9 Revision C employing Pyralux ®WA adhesive. Adhesion for the example and the control film results are given in Table I.

EXAMPLE 2 (CONTROL EXAMPLE 2C)

Control Example 2C

A 20.3% solids solution of PMDA/ODA polyamic acid (30.0 g) was thoroughly mixed with DMAc (20 ml) and centrifuged to remove air bubbles. The solution was cast into a film on a glass plate using a stainless steel rod supported at a fixed height above the glass plate surface by adhesive tape. The glass plate and film were heated on a hot plate for 20 minutes at a temperature of about 90° C. At the end of the 20 minutes, the glass plate and film were removed from the heat and cooled. The partially dried film was then stripped from the glass plate and restrained on a frame. The film was cured by placing the frame and film into a forced air oven for 30 minutes while increasing the temperature from 160° C. to 250° C. The film and frame were removed from the heat and cooled. The film was further cured in the frame at 400° C. for 5 minutes before being removed from the frame.

EXAMPLE 2

$SnCl_4 \cdot 2TPPO$ (0.056 g) was dissolved in a 20.3% solids DMAc solution of PMDA/ODA polyamic acid (30.0 g) with thorough mixing. The resulting solution was thoroughly mixed with DMAc, centrifuged, cast into a film, and cured as in Control Example 2C. The final film contained 0.15% Sn. Adhesion results for the example and control film are given in Table I.

EXAMPLE 3 (CONTROL EXAMPLE 3C)

Control Example 3C

A 14.6% solids BPDA/PPD polyamic acid solution (30.0 g) which also contained 2% triphenylphosphite release agent was mixed thoroughly with DMAc (5.0 ml) and the air bubbles allowed to rise and burst. The resulting solution was cast into a film on a glass plate using a stainless steel rod supported at a fixed height above the glass plate surface by adhesive tape. The film on the plate was heated 20 minutes at about 90° C. The plate and film were then removed from the heat and cooled. The film was then stripped from the plate and impaled on a pin frame to hold the film taut during further curing. The frame and film were placed into a forced air oven for 30 minutes while ramping the temperature from 160° C. to 250° C. The film and frame were removed from the heat and cooled. The film was further cured in the pin frame at 400° C. for 5 minutes before removing from the pin frame.

EXAMPLE 3

A thermally converted film was prepared as in Control Example 3C except that the polyamic acid solution was mixed thoroughly with a 1.2% solution of $SnCl_2$ in DMAc (5.0 ml) instead of DMAc alone. All other casting and curing steps were the same as in Control Example 3C. The final film contained 0.62% Sn. Adhesion results for the example and control film are given in Table I.

EXAMPLE 4

$SnCl_2$ (0.20 g) was dissolved in a 20.3% solids DMAc solution of PMDA/ODA polyamic acid (30.0 g) with thorough mixing. The resulting solution was thoroughly mixed with DMAc, cooled, acetic anhydride and beta-picoline thoroughly mixed into the solution, centrifuged, cast into a film, and cured as in Control Example 1C. The final film contained 0.11% Sn. Adhesion results are given in Table I.

EXAMPLE 5

Stannous acetate (0.024 g) was dissolved in cooled DMAc (12.7 ml) and beta-picoline (3.7 ml), then quickly and thoroughly mixed with 20.3% solids DMAc solution of PMDA/ODA polyamic acid (30.0 g) and acetic anhydride (3.6 ml). The casting and drying of the film were the same as for Control Example 1C. The final film contained 0.2 % Sn. Adhesion results are given in Table I.

TABLE 1

| Ex. No. | Dianhydride/ Diamine | Tin Salt** (wt. %) | Tin Conc.* (wt. %) | Peel Strength (pli) | |
|---|---|---|---|---|---|
| | | | | Casting Side | Air Side |
| 1C | PMDA/ODA | — | — | 1.7 | 1.8 |
| 2C | PMDA/ODA | — | — | 1.70 | 0.9 |
| 3C | BPDA/PPD | — | — | 2.9 | 2.1 |
| 1 | PMDA/ODA | $SnCl_2$ (0.71) | 0.45 | 14.9 | 9.7 |
| 2 | PMDA/ODA | $SnCl_4$ (1.0) · 2TPPO | 0.15 | 10.4 | 10.7 |
| 3 | BPDA/PPD | $SnCl_2$ (1.0) | 0.62 | 13.0 | 10.1 |
| 4 | PMDA/ODA | $SnCl_2$ (0.18) | 0.11 | 9.6 | 7.7 |
| 5 | PMDA/ODA | Stannous acetate (0.4) | 0.20 | 9.8 | 8.4 |

*weight % based on final film
**TPPO = triphenylphosphine oxide

EXAMPLE 6

Two types of 1 mil PMDA/ODA film, one set of samples containing 0.4% Sn in the final film (test film) and the other set of samples containing no Sn compound (control film), were introduced into ovens at four different temperatures. The test film was made by mixing a 5% stannous chloride in DMAc solution into the polyamic acid and was chemically converted in the same way as the control film. Thermal durability testing was conducted at 300° C., 325° C., 350° C. and 375° C.

Test and control samples were removed at each temperature at specified times and the tensile properties measured. For both test film and control film, the log percent elongation and log tensile strength were plotted against time at each temperature (as shown in FIGS. 1 and 2). A best fit straight line was extrapolated to 10% elongation or 15.85 kpsi tensile strength.

Figure 3A:
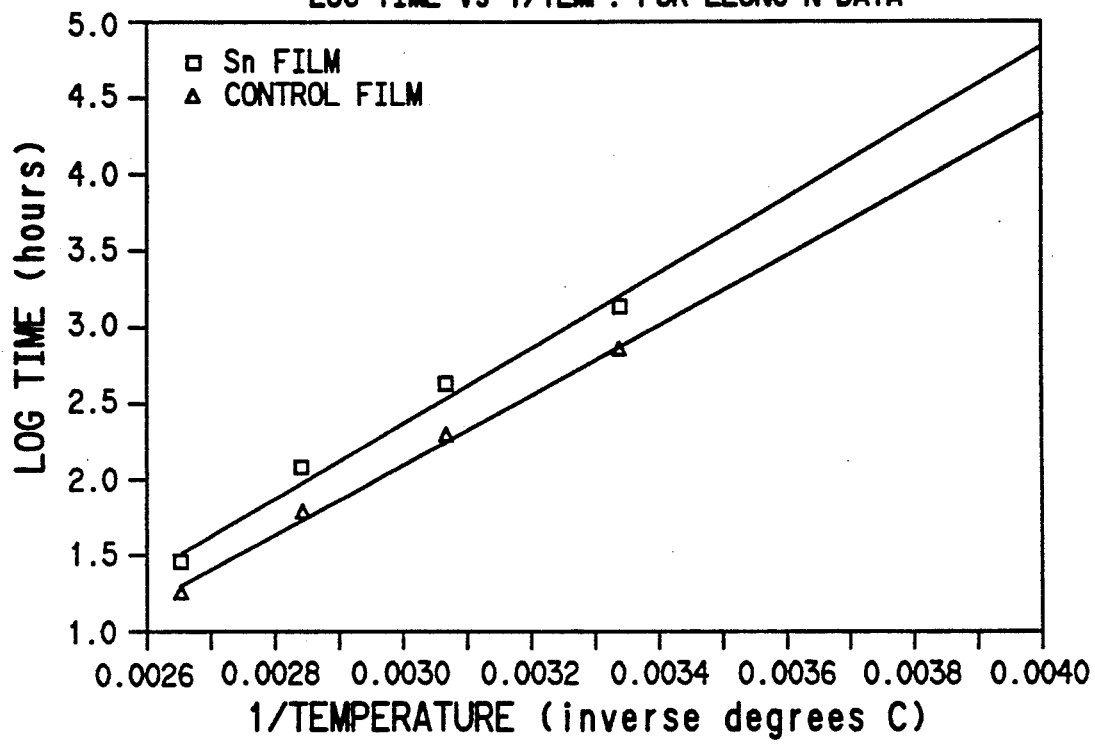
FIGS. 3a and 3b shows plots of time to reach 10% elongation or 15.85 Kpsi tensile strength vs. 1/temperature for a control film and a film of the invention.
Figure 3B:
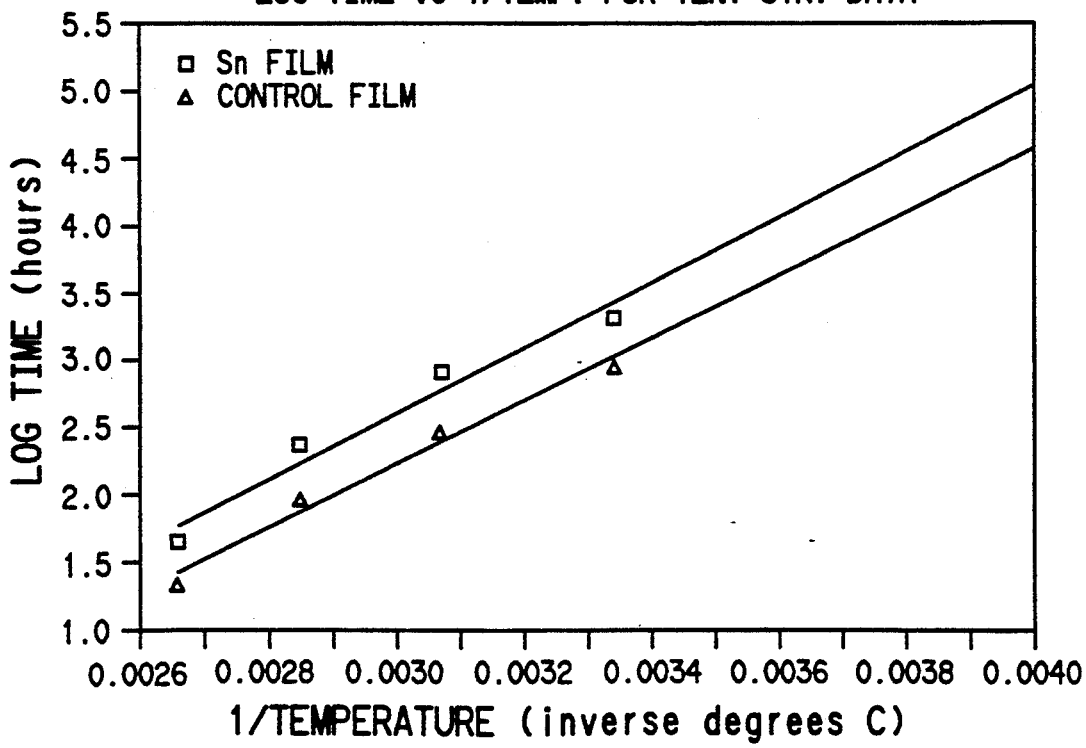

For both test film and control film, the log time to reach 10% elongation or 15.85 kpsi tensile strength at each temperature was plotted against 1/temperature. As shown in FIG. 3, the Sn-containing film had better thermal durability since the tensile properties of the test film did not decay away as rapidly as the control film.

We claim:

1. A polyimide film having a surface adhesion of at least 7 pli according to IPC Method 2.4.9 Revision C comprising stannous chloride, stannic chloride or tin II diacetate contained within said film, the amount of tin in said polyimide film being from 0.02 to 1% by weight based on the weight of the film.

2. The polyimdie film of claim 1 wherein the salt is tin (II) diacetate.

3. The polyimide film of claim 1 wherein the film is derived from pyromellitic dianhydride and 4,4'-diaminodiphenylether.

4. The polyimide film of claim 1 wherein the film is derived from biphenyl tetracarboxylic dianhydride and p-phenylene diamine.

* * * * *